(12) United States Patent
Bernhoff et al.

(10) Patent No.: US 6,194,699 B1
(45) Date of Patent: Feb. 27, 2001

(54) PHOTOCONDUCTIVE SWITCH WITH MULTIPLE LAYERS

(75) Inventors: Hans Bernhoff; Jan Isberg, both of Våsterås (SE)

(73) Assignee: Asea Brown Boveri AB, Vasteras (SE)

( * ) Notice: Subject to any disclaimer, the term of this patent is extended or adjusted under 35 U.S.C. 154(b) by 0 days.

(21) Appl. No.: 09/233,148

(22) Filed: Jan. 19, 1999

(51) Int. Cl.$^7$ .................................................. H01J 40/14
(52) U.S. Cl. .............................. 250/214 LS; 250/214.1; 257/77
(58) Field of Search ............................ 250/214 LS, 214.1, 250/214 R, 214 RC; 257/77, 463, 450, 439, 461, 607, 608

(56) References Cited

U.S. PATENT DOCUMENTS

| | | | |
|---|---|---|---|
| 4,240,088 | 12/1980 | Myers | 357/19 |
| 4,626,884 | 12/1986 | Shannon | 357/30 |
| 4,760,483 | 7/1988 | Kugelman et al. | 361/13 |
| 4,779,126 | 10/1988 | Herman | 357/38 |
| 4,782,222 | 11/1988 | Ragle et al. | 250/211 J |
| 4,825,061 | 4/1989 | Schoenbach et al. | 250/211 R |
| 5,002,034 | 3/1991 | Herden et al. | 123/643 |
| 5,173,761 | 12/1992 | Dreifus et al. | 257/22 |
| 5,283,706 | 2/1994 | Lillemo et al. | 361/3 |
| 5,294,814 | 3/1994 | Das | 257/77 |
| 5,306,928 | 4/1994 | Kimoto et al. | 257/77 |
| 5,442,199 | 8/1995 | Saito et al. | 257/77 |
| 5,452,170 | 9/1995 | Ohde et al. | 361/13 |
| 5,476,812 | 12/1995 | Kimoto et al. | 437/126 |
| 5,689,395 | 11/1997 | Duffy et al. | 361/93 |
| 5,804,815 | * 9/1998 | Loubriel et al. | 250/214.1 |

FOREIGN PATENT DOCUMENTS 0 562 549 A2  9/1993 (EP) .

OTHER PUBLICATIONS

Patent Abstracts of Japan, Abstract of JP 4–293272 A (Kobe Steel Ltd), Oct. 16, 1992.

* cited by examiner

Primary Examiner—Que T. Le
(74) Attorney, Agent, or Firm—Pollock, Vande Sande & Amernick

(57) ABSTRACT

A photoconductive switch comprises a first layer (1) of a first material sandwiches between two contact layers (2,3). The first layer is adapted to be conducting upon applying a voltage across said contact layers when irradiated by light (5) of an energy high enough for lifting charger carriers from the valence band to the conduction band of the first material. A first (2) of the contact layers is provided with apertures (4) for allowing light applied on the switch to reach said first layer there for making the switch conducting upon applying a voltage across the two contact layers. A thin second layer (7) is arranged on the side of the first contact layers, at least covering the surfaces of the first layer exposed through said apertures and forming an interface to said first layer in said apertures. The second layer is made of a material being able to form a well ordered interface to said first material and having the same or a larger band gap than the latter.

23 Claims, 2 Drawing Sheets

PHOTOCONDUCTIVE SWITCH WITH MULTIPLE LAYERS

TECHNICAL FIELD OF THE INVENTION AND PRIOR ART

The present invention relates to a photoconductive switch comprising at least a first layer of a first material and two contact layers arranged on opposite sides of the first layer and connectable to different potentials for applying a voltage across the first layer, said first layer being adapted to be conducting upon applying a voltage across said contact layers when irradiated by light of an energy high enough for lifting charger carriers from the valence band to the conduction band of said first material, a first of said contact layers being provided with apertures for allowing light applied on the switch from the side of said first contact layer to reach said first layer for making the switch conducting upon applying said voltage thereacross.

A switch of this type finds many applications, and it may for instance be used in equipment for handling high electric power for switching high voltages (which may be 2–400 kV) and currents, for examples in surge diverters, current limiters and the like. An advantage of a photoconductive switch is that light control provides for a very fast switching, which is of particular importance in high power applications for protection of equipment when faults occur.

A common problem of such photoconductive switches being irradiated from the same side as one of the contact layers, so-called vertical switches, is the difficulty to obtain a good contact with a low contact resistance on the side of the irradiation and at the same time an efficiently high generation of free charge carriers in the first layer by the irradiation. The regions of the first layer covered by said contact will be in the shadow, i.e. no light will reach these regions and generate free charge carrier there, which means that the conductivity will be low in these regions. It is no practical solution to make the apertures very large and accordingly the contact layer portions separated by said apertures very small, since this will reduce the active area, i.e. the area which may be reach by charge carriers in the conducting state of the switch, of the switch to much and make a substantial contact resistance contribution to the total resistance of the switch.

This problem is there irrespectively of the material of said first layer, but it is more accentuated for some materials, such as diamond, being hard to dope and having a large band gap (energy gap between the valence and the conduction band thereof). a possible way of obtaining a partial solution to this problem for some other materials is namely to dope said first layer very highly in the regions next to the first contact layer, which means that free charge carriers created in the first layer by said irradiation will easier reach the first contact also through the regions in "shadow". Another possible way to such a partial solution of the problem is to deposit a layer of conducting transparent In-doped $SnO_2$ on the first layer as contact layer, but this solution is only available for materials of the first layer having a band gap being less than 4.2 eV (the band gap of $SnO_2$).

Diamond, which has a band gap of approximately 5.4 eV and being hard to dope will hereinafter for illuminating but not in any way limiting the invention be discussed, since this is a material for which none of the partial solutions mentioned above may be used. Thus, it is not possible to reduce the contact resistance by highly doping the diamond layer next to the first contact layer, and a use of $SnO_2$ in the way mentioned above is not possible, since $SnO_2$ would absorb most of the high-energy light required for making the diamond conductive, so it will never reach the diamond layer.

SUMMARY OF THE INVENTION

The object of the present invention is to provide a photoconductive switch of the type defined in the introduction having a lower contact resistance on the side of said first contact layer than known photoconductive switches of this type.

This object is according to the invention obtained by arranging a thin second layer on the side of the first contact layer, at least covering the surfaces of the first layer exposed through said apertures and forming an interface to said first layer in said apertures, that the second layer is made of a material being able to form a well ordered interface to said first material and having the same or a larger energy gap between the valence band and the conduction band thereof as or than said first material for allowing said light to pass therethrough without being to a substantial degree absorbed by said second layer.

The active contact area of the first contact layer will for a given geometric area of the first contact layer be increased, since the charger carriers may reach the first contact layer through said second layer in said apertures without travelling though the regions "in shadow". It is for this sake important that the interface between the first layer and the second one is well ordered, so that the charger carriers and the light will not at said interface be caught by electrical and optical traps, respectively, increasing the resistance of the switch. It will in this way be possible to reduce the geometric area of the first contact layer, i.e. make the apertures larger, and still have a sufficiently large active contact area for not limiting the current handling capability of the switch to much. This results in a smaller total area of the regions in "shadow" reducing the resistance of the switch when irradiated.

By making said second layer thin and of a material having a band gap being at least as high as the band gap of said first material there will be no risk that any major part of the light is absorbed by this second layer.

According to a preferred embodiment of the invention said second layer covers also the first contact layer, which is very preferable, since this will increase the active area of the first contact layer even more, since it is now possible for charge carriers to reach the contact layer through said apertures also at the surfaces of the first contact layer directed away from the first layer. This means that the geometric area of the first contact layer may be reduced further resulting in an increasing of the advantages of the application of said second layer mentioned above.

According to another preferred embodiment of the invention the material of the second layer has substantially the same gap between the valence band and the conduction band as said first material. This means that some of the light will be absorbed by said second layer, which may lower the resistance of the switch further.

According to another preferred embodiment of the invention the material of the second layer is at least next to the interface to the first layer the same as said first material, which is advantageous, since this means that it will normally be easy to form a well ordered interface between the first and the second layer, since the lattice-match will be exact, and it is then preferred that the material of the second layer is the same as the material of the first layer. Using the same material also means that the requirement concerning the energy band gap will automatically be fulfilled.

According to another preferred embodiment of the invention the energy gap between the valence band and the conduction band of the first material exceeds 4,5 eV, and the invention is particularly applicable to switches being built of such material, since there is no longer any possibility to use a conducting transparent $SnO_2$-layer as mentioned above.

According to another very preferred embodiment of the invention said first material is diamond. Diamond is, as mentioned, very hard to dope and it has a considerably larger band gap than $SnO_2$, namely 5.4 eV compared to 4.2 eV, but it would be very well suited as a material in a photoconductive switch thanks to some excellent physical properties of diamond. Diamond has namely an extremely high breakdown field strength, which means that a photoconductive switch of diamond may hold very high voltages in the blocking state thereof, i.e. when it is switched off. Furthermore, diamond has a high conductivity due to comparatively high charger carrier mobility therein. Thus, diamond is very interesting to use in a switch of this type, but it has been difficult to use until now in such a "vertical" switch as a consequence of the contact resistance problems mentioned above. Accordingly, diamond is preferably used in its intrinsic form. "Intrinsic diamond" means that the diamond is either undoped or compensation doped or that the dopants are not thermally activated at temperatures of interest. It is particularly preferred to have said second layer also made of diamond for obtaining a very good interface between the first and the second layer, and it will actually be possible to grow the second layer on top of the first layer by CVD at high temperatures without creating any real interface at all, but the mobility will in practice be the same as the bulk mobility of diamond at said "interface".

According to another very preferred embodiment of the invention said contact layers are made of one of tantalum, titanium and tungsten, which is preferred in the case of diamond as the material for the second layer, since these materials may withstand the high temperatures (800–900°C.) required for the CVD-growth of the second layer.

Further advantages and advantageous features of the invention will appear from the following description and the other dependent claims.

BRIEF DESCRIPTION OF THE DRAWINGS

With reference to the appended drawings, below follows a specific description of preferred embodiments of the invention cited as examples.

In the drawings.

DETAILED DESCRIPTION OF PREFERRED EMBODIMENTS OF THE INVENTION

Figure 1:
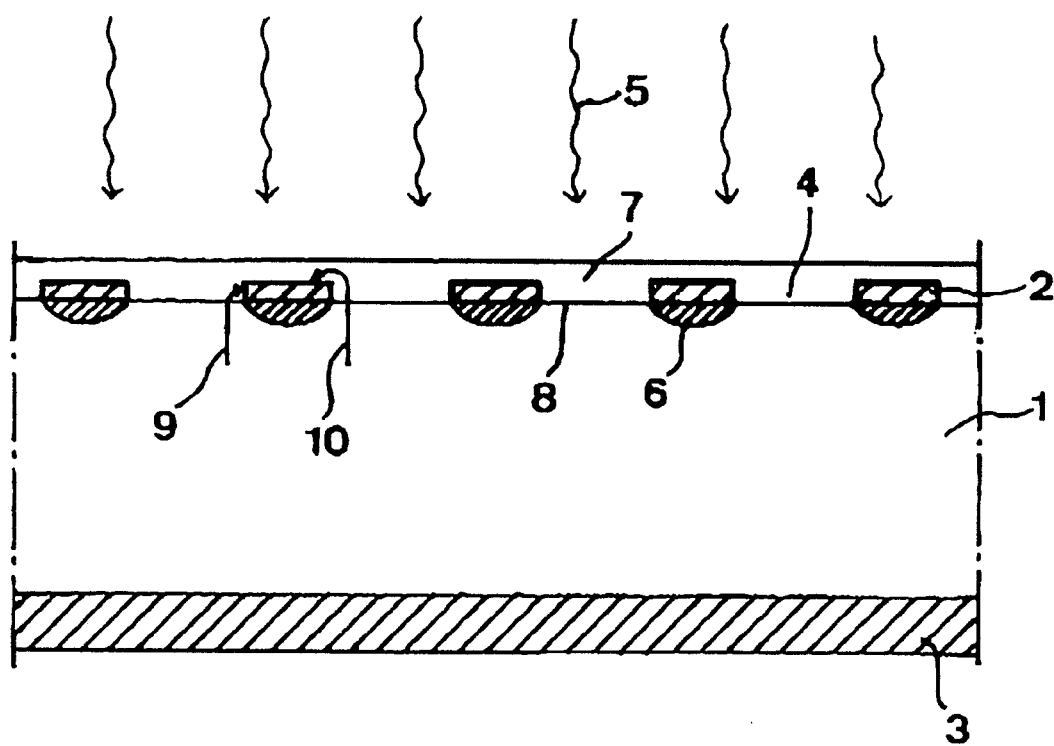
FIG. 1 is a schematic cross-section view of a photoconductive switch according to a first preferred embodiment of the invention.

A photoconductive switch according to a preferred embodiment of the invention is very schematically shown in FIG. 1, and this switch has a first layer 1, which in this case is made of intrinsic diamond and typically may have a thickness of about 200 μm, and two contact layers arranged on opposite sides thereof, namely a first contact layer 2 and a second contact layer 3 which are connectable to different potentials for applying a voltage across the first layer 1. Accordingly, the two contact layers are adapted to be connected to an electrode each (not shown) for connecting the switch to for example an electric circuit of an apparatus for controlling a power network.

The first contact layer 2 is provided with apertures 4 allowing light 5 applied on the switch from the side of the first contact layer to reach the first layer for making the switch conducting upon applying a voltage thereacross, irrespectively of the direction of such voltage. The intrinsic diamond of the first layer 1 has a gap between the variance band and the conduction band of approximately 5.4 eV, which means that said height 5 has to have at least this energy for exciting charge carriers in the valence band of the diamond for lifting them to the conduction band. It is illustrated how "a shadow" 6 is formed under the first contact layer, which means that no free charge carriers are generated in the diamond layer there, and the conduction of the switch will be very low there.

A thin second layer 7, also of intrinsic diamond, is applied upon the first layer in said apertures and also covering the first contact layer. This layer may typically have a thickness of about 10 μm. It will be possible to obtain a very well ordered interface between the first and second layer when using the same material, here intrinsic diamond, for both, and in the diamond case there will be no actual interface, but this is here nevertheless indicated by the line 8. This second layer will increase the active area of the first contact layer remarkably, which is illustrated by the arrows 9 and 10, since the charge carriers generated in the first layer 1 by said irradiation may now move through said apertures into the second layer and reach the first contact layer from the lateral direction and also the upper surface thereof. This means that the apertures 4 may be made much larger without reducing the active area of the first contact layer with respect to the case of no such second layer, so that the first contact layer may perhaps only cover a few percent of the total area of the first layer. This means that the first layer will be exposed to said light 5 to a much larger extent and the conductivity of the switch in the on-state may be that be increased.

Another advantage of the provision of said second layer 7 is that the first contact layer is by that embedded by an electrically insulating material, so that an electric insulation thereof in the dark insulating state of the switch is obtained. The layer 7 will also function as a passivation layer of the switch, i.e. it protects the electronically active first layer, such as diamond, against influences of the environment.

Figure 2:
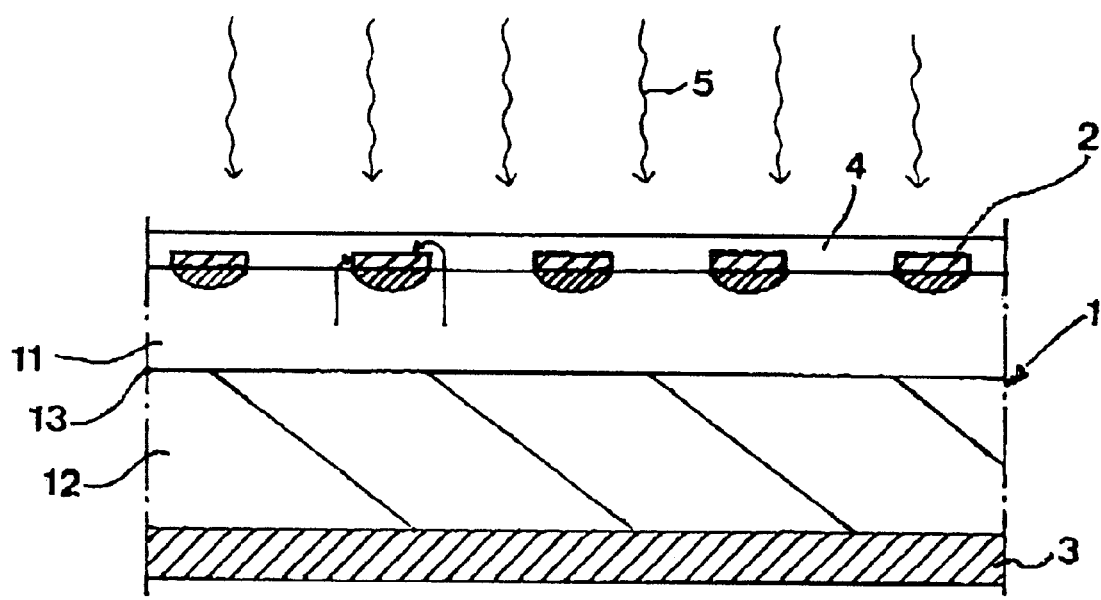
FIG. 2 is a view corresponding to FIG. 1 of a switch according to a second preferred embodiment of the invention.

A switch according to a second preferred embodiment of the invention is schematically shown in FIG. 2, and this differs from that shown in FIG. 1 by the fact that the first layer is made of two superimposed sub-layers 11, 12 of semiconductor materials, for instance SiC, Si, GaN, AlN or BN, being doped according to opposite conductivity types, n and p for forming a photoconductive rectifying diode, which will always be conducting when the pn-junction 13 is forward biased and blocking when the pn-junction is reversed biased and said first layer is not irradiated by said light 5 but conducting when said first layer is irradiated. A switch made of such semiconductor materials, which may accordingly be doped much easier than diamond, is also very preferred, although the advantage of the provision of said second layer is not that great with respect to such switches having no such second layer, since it is possible to dope these materials highly for counteracting the influence of said "shadows" to some extent, and for materials having a smaller band gap than 4.2 eV it is also possible to use a transparent conducting film of In-doped $SnO_2$. It is also of course within the scope of the invention to have doped diamond as the material of the first layer.

The invention is of course not in any way restricted to the preferred embodiments described above, but many possibilities to modifications thereof would be apparent to a man with ordinary skill in the art without departing from the basic idea of the invention.

The first and second layers may be of any materials suitable for a photoconductive switch and are not at all restricted to those mentioned above.

In the case of the use of normal white light having a comparatively broad spectra for irradiating said first layer it would be preferred to have a second layer of another material than the first one and having a somewhat larger band gap than the first material for better utilising the light and avoiding that a large part thereof with higher energies than corresponding to the band gap of the first material will be absorbed by the second material.

The claim definition "crystalline materials" includes mono—as well as polycrystalline materials.

What is claimed is:

1. A photoconductive switch comprising at least a first layer (1) of a first material and two contact layers (2,3) arranged on opposite side of the first layer and connectable to different potentials for applying a voltage across the first layer, said first layer being adapted to be conducting upon applying a voltage across said contact layers when irradiated by light (5) of an energy high enough for lifting charge carriers from the valence band to the conduction band of said first material, a first of said contact layers being provided with apertures (4) for allowing light applied on the switch from the side of said first contact layer to reach said first layer for making the switch conducting upon applying said voltage thereacross, characterized in that it comprises a thin second layer (7) arranged on the side of the first contact layer, at least covering the surfaces of the first layer exposed through said apertures and forming an interlace to said first layer in said apertures, that the second layer is made of a material being able to form a well ordered interface to said first material and having the same or a larger energy gap between the valence band and the conduction band thereof as or than said first material for allowing said light to pass therethrough without being to a substantial degree absorbed by said second layer.

2. A switch according to claim 1, characterized in that said second layer (7) covers also the first contact layer (2).

3. A switch according to claim 1, characterized in that the material of the second layer (7) has substantially the same gap between the valence band and the conduction band as said first material.

4. A switch according to claim 1, characterized in that the material of the second layer (7) is at least next to the interface to the first layer (1) the same as said first material.

5. A switch according to claim 4, characterized in that the material of the second layer (7) is the same as the material of the first layer (1).

6. A switch according to claim 1, characterized in that the first layer (1) as well as the second layer (7) are made of crystalline materials.

7. A switch according to claim 1, characterized in that the energy gap between the valence band and the conduction band of the first material exceed 3 eV.

8. A switch according to claim 1, characterized in that the energy gap between the valence band and the conduction band of the first material exceeds 4.5 eV.

9. A switch according to claim 1, characterized in that said first layer (1) is made of an intrinsic material, and the switch will be conducting when the first layer is irradiated and a voltage is applied across the contact layers (2,3) thereof irrespectively of the direction of said voltage and in a blocking state when no irradiation of the first layer takes place.

10. A switch according to claim 1, characterized in that said first material is diamond.

11. A switch according to claim 10, characterized in that the diamond is doped.

12. A switch according to claim 10, characterized in that the material of said second layer (7) has an energy gap between the valence band and the conduction band being at least 5.4 eV.

13. A switch according to claim 1, characterized in that said contact layers (2,3) are made of one of tantalum, titanium and tungsten.

14. A switch according to claim 1, characterized in that said first layer is made of at least two superimposed sub-layers (11, 12) of semiconductor materials being doped according to opposite conductivity types, n and p, for forming a rectifying diode, which will always be conducting when the pn-junction is forward biased and blocking when the pn-junction is reversed biased and said first layer is not irradiated by said light but conducting when said first layer is irradiated.

15. A switch according to claim 1, characterized in that said first material is SiC.

16. A switch according to claim 1, characterized in that said first material is Si.

17. A switch according to claim 1, characterized in that said first materials is GaN, AlN, or BN.

18. A switch according to claim 1, characterized in that the material of the second layer is electrically insulating and electrically insulates parts of the first contact layer separated by a said aperture (4).

19. A switch according to claim 1, characterized in that the second layer (7) is adapted to function as a passivation layer of the switch and protect the first layer against influences of the environment.

20. A switch according to claim 1, characterized in that the second layer (7) has a thickness of less than 20 $\mu$m, preferably 5–15 $\mu$m.

21. A switch according to claim 1, characterized in that the second layer (7) has a thickness being less than 1/10 of the thickness of the first layer.

22. A use of a photoconductive switch according to claim 1 switching high powers and/or high voltages and/or high currents.

23. A use according to claim 22 in a surge diverter or current limiter for protection of equipment in high power distribution plants.

* * * * *